United States Patent
Hu et al.

(10) Patent No.: US 9,221,675 B2
(45) Date of Patent: Dec. 29, 2015

(54) CHIP WITH INTEGRATED CIRCUIT AND MICRO-SILICON CONDENSER MICROPHONE INTEGRATED ON SINGLE SUBSTRATE AND METHOD FOR MAKING THE SAME

(75) Inventors: Wei Hu, Suzhou (CN); Gang Li, Suzhou (CN); Jia-Xin Mei, Suzhou (CN)

(73) Assignee: MEMSENSING MICROSYSTEMS TECHNOLOGY CO., LTD, Suzhou (CN)

( * ) Notice: Subject to any disclaimer, the term of this patent is extended or adjusted under 35 U.S.C. 154(b) by 520 days.

(21) Appl. No.: 13/561,194

(22) Filed: Jul. 30, 2012

(65) Prior Publication Data
US 2013/0202136 A1 Aug. 8, 2013

(30) Foreign Application Priority Data
Feb. 6, 2012 (CN) .......................... 2012 1 0024962

(51) Int. Cl.
*B81C 1/00* (2006.01)
*H04R 31/00* (2006.01)
*H04R 19/00* (2006.01)

(52) U.S. Cl.
CPC ......... *B81C 1/00158* (2013.01); *B81C 1/00246* (2013.01); *H04R 19/005* (2013.01); *H04R 31/00* (2013.01)

(58) Field of Classification Search
CPC .................... B81C 1/00158; B81C 1/00246
USPC ................................................. 438/50, 53
See application file for complete search history.

(56) References Cited

U.S. PATENT DOCUMENTS

| | | | |
|---|---|---|---|
| 8,227,286 B2* | 7/2012 | Nunan et al. | 438/50 |
| 2012/0326248 A1* | 12/2012 | Daneman et al. | 257/415 |
| 2012/0326249 A1* | 12/2012 | Rombach | 257/416 |

* cited by examiner

*Primary Examiner* — Yu-Hsi D Sun
(74) *Attorney, Agent, or Firm* — Ladas & Parry, LLP

(57) ABSTRACT

A method for integrating an IC and a MEMS component includes the following steps: S1) providing a SOI base (20) having a first area (21) and a second area (22); S2) fabricating an IC on the first area through a standard semiconductor process, and simultaneously forming a metal conductive layer (26) and a medium insulation layer (25c) extending to the second area; S3) partly removing the medium insulation layer and then further partly removing the silicon component layer so as to form a backplate diagram; S4) depositing a sacrificial layer (32) above the SOI base; S5) forming a Poly Si1-xGex film (33) on the sacrificial layer; S6) forming a back cavity (34); and S7) eroding the sacrificial layer to form a chamber (36) in communication with the back cavity. Besides, a chip (10) fabricated by the above method is also disclosed.

15 Claims, 7 Drawing Sheets

CHIP WITH INTEGRATED CIRCUIT AND MICRO-SILICON CONDENSER MICROPHONE INTEGRATED ON SINGLE SUBSTRATE AND METHOD FOR MAKING THE SAME

CROSS-REFERENCE TO RELATED APPLICATIONS

This application claims to priority to Chinese Patent Application No. 2012100249621 filed on Feb. 6, 2012 the disclosure of which is incorporated herein by reference in its entirety.

BACKGROUND OF THE INVENTION

1. Field of the Invention

The present invention relates to a chip with an IC (Integrated Circuit) and a micro-silicon condenser microphone integrated on a single SOI (Silicon On Insulator) substrate and a method for fabricating the chip.

2. Description of Related Art

Microphone is a transducer for changing sound signals into electronic signals. The traditional silicon condenser microphone typically includes a diaphragm acting as one electrode of a variable capacitance and a backplate acting as the other electrode of the capacitance. With sound signals entering the microphone, the diaphragm is deformed under influence of the sound pressures of the sound signals, which changes the capacitance between the diaphragm and the backplate. As a result, the change of the capacitance is transformed into the electronic signals by the subsequent processing circuits.

Since Electrets Condenser Microphone (ECM) was firstly invented by scientists of Bell Laboratories in 1962, with several decades development, the ECM has been widely used in multiple kinds of fields. The ECM has stored charge either in its backplate or diaphragm. However, such stored charge is easily leaked under high temperatures up to 260 degrees during automotive assembly. So, the ECM can only be mounted to a PCB by hand. With fast development of consumer electronics, such as mobile phones, PDAs, MP3 players and digital cameras etc., the ECM is losing its competition in such consumer electronics.

MEMS (Micro Electro Mechanical Systems) is a new technology rapidly developed in recent years. MEMS technology adopts advanced semiconductor fabrication processes and can realize mass production of MEMS components. Because of its potential advantages in miniaturization, performance, reliability, environmental endurance, low cost, mass production capability and high-temperature resistance capability, the MEMS component has been widely recognized as the next generation product to replace the conventional ECM.

Unlike the ECM, the micro-silicon condenser microphone fabricated by the MEMS technology depends on the external bias voltage to pump the required charge into its variable capacitor. As a result, the micro-silicon condenser microphone is needless of worrying about leaking of the stored charge. Since the micro-silicon condenser microphone can endure high temperatures during surface mountable installation, it can be automatically assembled on the corresponding PCB instead of hand installation.

In a convention method, the MEMS component and the IC are integrated by multiple substrates. That is to say, different companies adopt different processes to independently make the MEMS component and the IC on different substrates, and then the MEMS component and the IC are integrally packaged to a functional unit. Understandably, the conventional multiple substrate integration needs easy fabrication technique and the MEMS component and the IC can be optimized separately. Such multiple substrate integration has been widely used in kinds of MEMS component integrations, such as piezoresistance type sensors.

However, regarding some special applications, e.g. piezoelectric or condenser sensors with high output impedance, single substrate integration of the IC and the MEMS component has more advantages. The single substrate integration is capable of improving integral capability of the integral component and decreases influence of disturbing noise. The micro-silicon condenser microphone has characteristics of high output impedance, while it is easily influenced by the environmental disturbing noise and parasitic capacitance. Comparing with the multiple substrate integration, the single substrate integration of fabricating the micro-silicon condenser microphone greatly improves its integral component capability, dimension and power consumption.

Nowadays, there are three kinds of methods of single substrate integration. The first method is to fabricate the MEMS component first and then finish the fabrication of the IC on a same single substrate. The second method is interlaced fabricate the MEMS component and the IC are on the same single substrate. The third method is to fabricate the IC through standard semiconductor processes and then to fabricated the MEMS component on the same substrate. However, the IC manufactured by the first and the second methods is easily polluted by the prior MEMS component. The third method can avoid the pollution in the first and the second methods, and the third method can use existing standard semiconductor processes and reduce equipment investment. Regarding the third method, after the IC is fabricated on the substrate, high temperature must be avoided in subsequent steps for fabricating the MEMS component because the metal electrodes of the IC cannot endure high temperatures over 400 degrees. However, in the conventional MEMS technology, polycrystalline silicon is usually adopted as a structure material and the temperature of fabricating the polycrystalline silicon usually surpasses 400 degrees.

Hence, it is desirable to provide an improved chip with an IC and a micro-silicon condenser microphone integrated on a single substrate and a corresponding method for making the chip.

BRIEF SUMMARY OF THE INVENTION

The present invention provides a method for integrating an Integrated Circuit (IC) and a micro-silicon condenser microphone. The method includes the following steps:

S1) providing a SOI (Silicon On Insulator) base having a first surface, the first surface comprising a first area for fabricating the IC and a second area for fabricating the micro-silicon condenser microphone, the SOI base comprising a silicon component layer;

S2) fabricating the IC on the first area for electrically connecting the micro-silicon condenser microphone through a standard semiconductor process, and forming a metal conductive layer and a medium insulation layer on the second area simultaneously fabricated with the IC;

S3) partly removing the medium insulation layer to expose the silicon component layer, then further partly removing the silicon component layer so as to form a backplate diagram and a plurality of sound holes, the silicon component layer acting as a first electrode plate of a microphone capacitance;

S4) depositing a sacrificial layer above the SOI base via a low-temperature deposition process, the sacrificial layer filling in the sound holes;

S5) forming a Poly Si1-xGex film on the sacrificial layer, the Poly Si1-xGex film acting as a second electrode plate of the microphone capacitance;

S6) forming a back cavity on a second surface of the SOI base opposite to the first surface; and S7) eroding the sacrificial layer from the sound holes to form a chamber between the first electrode plate and the second electrode plate and further release the second electrode plate to be a movable structure, the chamber being in communication with the back cavity through the sound holes.

The present invention provides a chip with an Integrated Circuit (IC) and a micro-silicon condenser microphone integrated on a single substrate. The chip includes a SOI base having a first area and a second area, an IC formed on the first area and a micro-silicon condenser microphone formed on the second area. The SOI base includes a silicon component layer. The micro-silicon condenser microphone is electrically connecting the IC. The micro-silicon condenser microphone includes a backplate formed by the silicon component layer, a sound-sensitive film opposite to the first electrode plate with a chamber formed therebetween, a back cavity and a plurality of sound holes extending through the silicon component layer to communicate the back cavity and the chamber. The material of the sound-sensitive film is a Poly Si1-xGex film.

The method according to the present invention is based on the standard semiconductor process and only needs to sequentially fabricate the micro-silicon condenser microphone on the single SOI substrate. As a result, the micro-silicon condenser microphone can be integrated with the IC on the single SOI substrate so as to ultimately form a high-sensitive single integrated chip. From another viewpoint, the present method is compatible to existing standard semiconductor process and cost for making such chip is greatly saved.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENT

Figure 1:
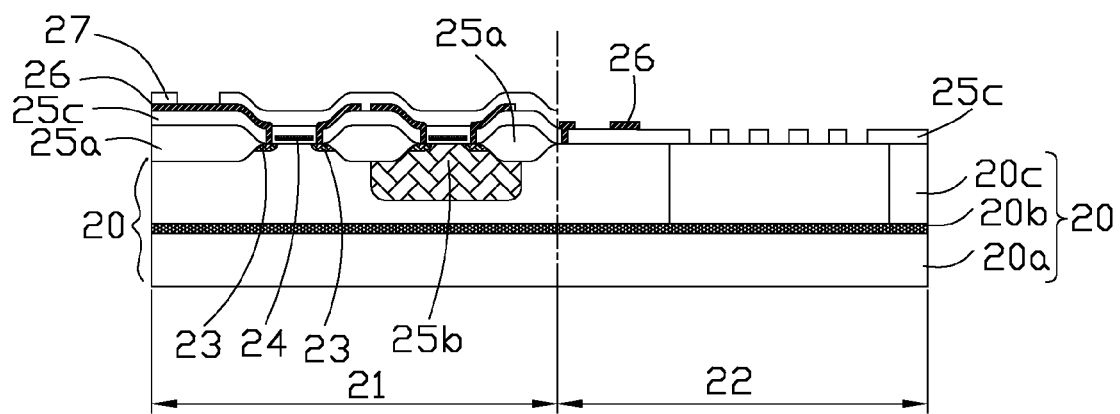
FIGS. 1 to 6 are schematic cross-sectional views showing steps for fabricating a chip with an IC and a micro-silicon condenser microphone integrated on a single substrate in accordance with an illustrated embodiment of the present invention.

Reference will now be made to the drawing figures to describe the preferred embodiment of the present invention in detail. The illustrated embodiment of the present invention discloses a chip 10 with an IC and a micro-silicon condenser microphone integrated on a single substrate, and a method for fabricating the chip 10 so as to realize single integration of a circuit component and a MEMS component. The fabrication method of the present invention is needless of altering a standard semiconductor process and only needs to sequentially fabricate the MEMS component on the prior finished circuit silicon chip which has already been finished under the standard semiconductor process. The method based on a SOI (Silicon On Insulator) substrate for integrating an IC and a micro-silicon condenser microphone will be described in detail for well understanding the present invention.

The method for integrating the IC and the micro-silicon condenser microphone includes the following steps:

S1): referring to FIG. 1, providing a SOI base 20 having a first surface (e.g. a top surface of the illustrated embodiment). The first surface includes a first area 21 for fabricating the IC and a second area 22 for fabricating the micro-silicon condenser microphone. The SOI base 20 includes a silicon base 20a, an insulation silicon dioxide layer 20b covering the silicon base 20a and a silicon component layer 20c covering the insulation silicon dioxide layer 20b.

S2): referring to FIG. 1, fabricating the IC on the first area 21 for electrically connecting the micro-silicon condenser microphone through the standard semiconductor process. The IC can be a Filed Effect Transistor (FET), or a resistance, or a capacitor etc. Take a Metal Oxide Semiconductor Field Effect Transistor (MOSFET) for figure simplicity, the MOSFET component includes a field oxide layer 25a, a source/drain dopant area 23, a grid conducting layer 24, a medium insulation layer 25c, a metal conductive layer 26 and a passivation layer 27 etc. Simultaneously, the field oxide layer 25a, the medium insulation layer 25c, the metal conductive layer 26 and the passivation layer 27 formed on the first area 21 all further extend to the second area 22. That is to say, the second area 22 is provided with the field oxide layer 25a, the medium insulation layer 25c, the metal conductive layer 26 and the passivation layer 27 simultaneously fabricated with the IC.

Figure 2:
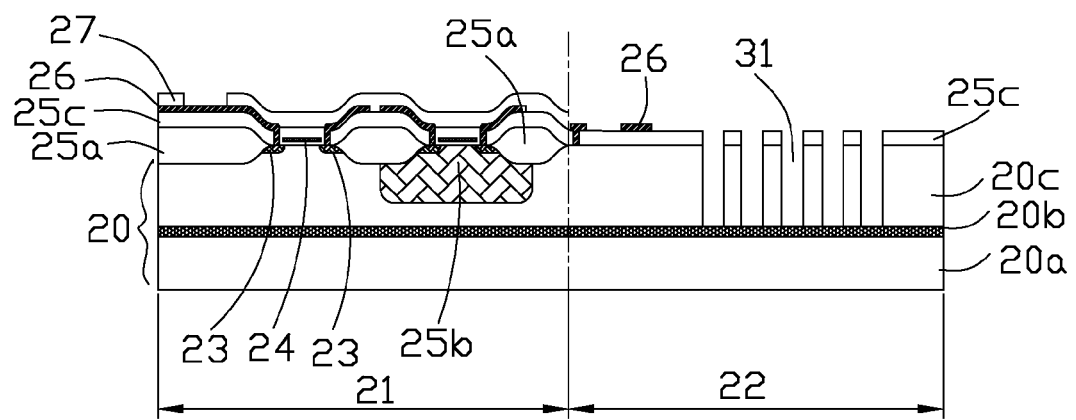

S3): referring to FIG. 2, partly removing the filed oxide layer 25a, the medium insulation layer 25c, the metal conductive layer 26 and the passivation layer 27 formed on the second area 22 so as to expose the silicon component layer 20c. Then, the silicon component layer 20c is partly removed via a Deep Reactive Ion Etching (DRIE) process, or lithographic and etching processes. The above etching is automatically terminated at the insulation silicon dioxide layer 20b. On the second area 22, the integral silicon component layer 20c acts as a first electrode plate (e.g. a backplate of the illustrated embodiment) of a microphone capacitance. According to the above etching, a backplate diagram is formed and a plurality of sound holes 31 are formed on the backplate. The backplate diagram can be round, rectangular or other shapes. The sound holes 31 are capable of realizing adjusting oscillation damp of a sound-sensitive film, transmitting sound and helping release etc.

Figure 3:
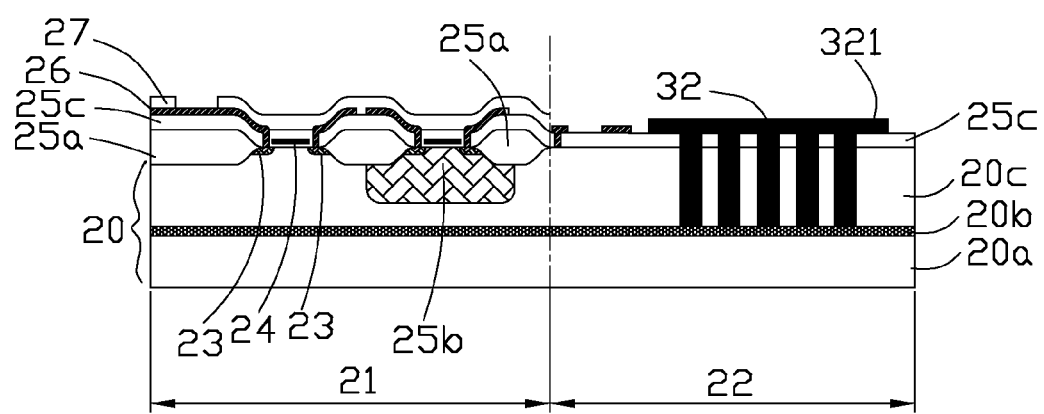

S4): referring to FIG. 3, depositing a sacrificial layer 32 above the silicon base 20a and the insulation silicon dioxide layer 20b via a low-temperature deposition process under 400 degrees. When the sacrificial layer 32 grows on the top, it also grows inside the sound holes 31, as a result that the sound holes 31 are filled in by the sacrificial layer 32 and ultimately a flat layer 321 is formed on top of the sound holes 31 and covering the medium insulation layer 25c. The material of the sacrificial layer 32 includes, but not limited to, a Poly Ge film which is made via a Low Pressure Chemical Vapor Deposition (LPCVD) process or a Plasma Enhanced Chemical Vapor Deposition (PECVD) process, or a silicon dioxide which is made via the PECVD process.

Figure 4:
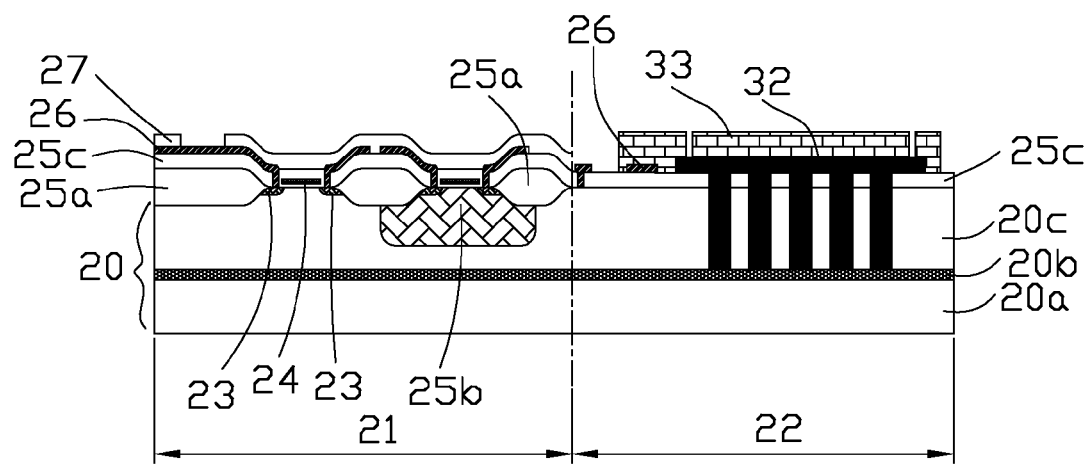

S5): referring to FIG. 4, forming a Poly Si1-xGex film 33 on the sacrificial layer 32 via the LPCVD process under 400 degrees, or via the PECVD process. The Poly Si1-xGex film 33 not only covers the sacrificial layer 32, but also covers the medium insulation layer 25c for subsequently forming an anchor point 32a. The above processes need silane, germane, borane etc. as reactant. The flow, pressure and proportion of the reactant can be adjusted according to requirement so as to form required proportion of silicon and germanium. According to the above adjustment, the Poly Sil-xGex film 33 can be achieved and meet certain stress and anti-corrosive requirement. Then, the Poly Sil-xGex film 33 is etched via the lithographic and etching processes so as to form a second electrode plate (e.g. a sound-sensitive film of the illustrated embodiment) of the microphone capacitance. Meanwhile, as shown in FIG. 4, the IC realizes electrical connection with the micro-silicon condenser microphone via the Poly Sil-xGex film 33 electrically connecting the metal conductive layer 26. The second electrode plate can be round, rectangular or other shapes.

Figure 5:
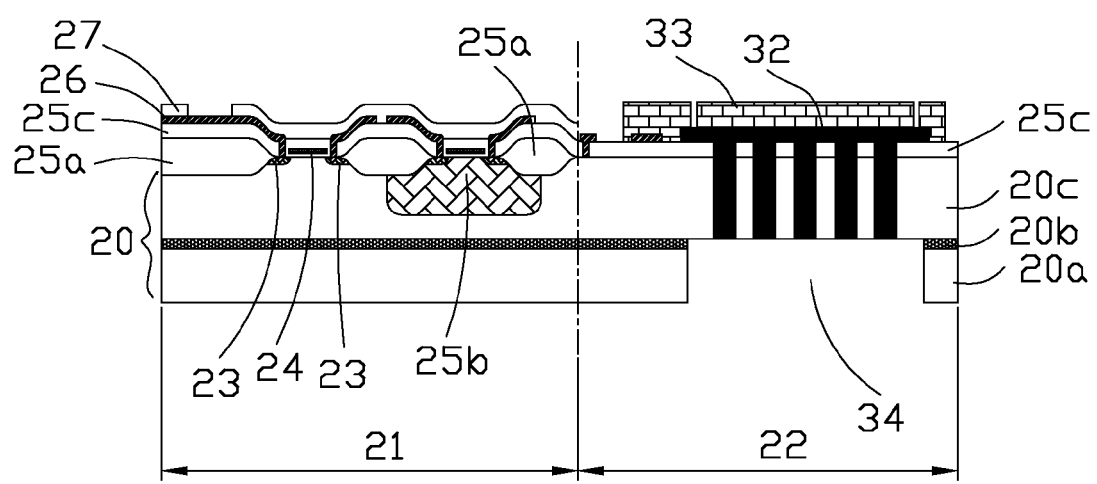

S6): referring to FIG. 5, lithographing a second surface (e.g. a bottom surface of the illustrated embodiment opposite to the first surface) of the SOI base 20 corresponding to the second area 22, and then removing part of the insulation silicon dioxide layer 20b of the SOI base 20 so as to form a back cavity 34 via an anisotropic wet etching process (e.g. adopting KOH or tetramethylammonium hydroxide (TMAH) etc. as an etchant) or a dry etching process (e.g. DRIE technology). The back cavity 34 functions as transmitting sound and adjusting frequency response etc. Besides, the back cavity 34 is connected with the sacrificial layer 32 filled in the sound holes 31.

Figure 6:
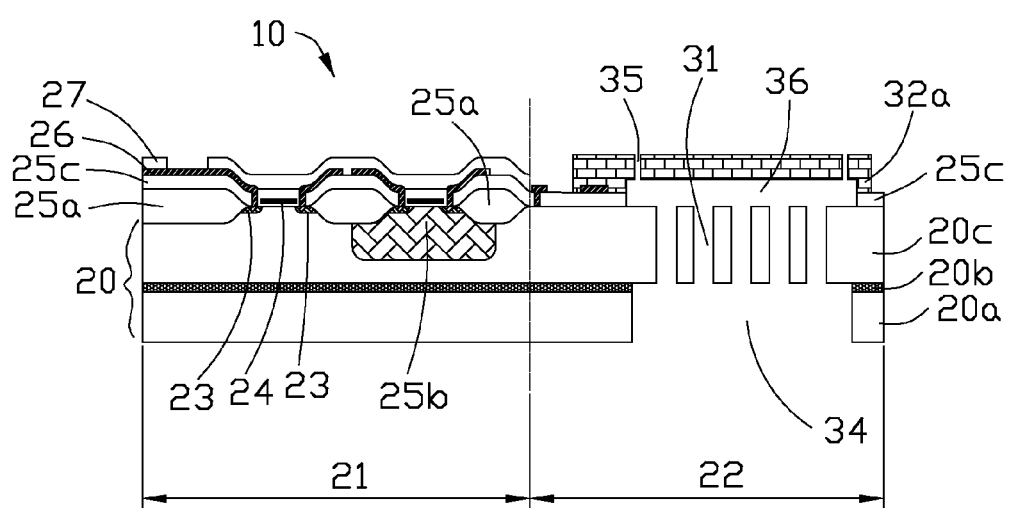

S7): referring to FIG. 6, eroding the sacrificial layer 32 and the medium insulation layer 25c from the sound holes 31 so as to release the second electrode plate to be a movable structure. According to the illustrated embodiment of the present invention, when the material of the sacrificial layer 32 is Ge, the etchant is heated hydrogen peroxide. Because hydrogen peroxide has great different corrosion rate regarding the Poly Ge and the Poly Sil-xGex, the heated hydrogen peroxide is a suitable matter for only eroding the sacrificial layer 32 made of Poly Ge, while remaining the second electrode plate made of Poly Sil-xGex. The medium insulation layer 25c is subsequently eroded by dilute hydrofluoric acid. However, when the material of the sacrificial layer 32 is the silicon dioxide, the dilute hydrofluoric acid is a suitable etchant for simultaneously eroding away the medium insulation layer 25c and the sacrificial layer 32.

Referring to FIG. 6, the sacrificial layer 32 filled in the sound holes 31 is ultimately eroded away so as to expose the sound holes 31 in communication with the back cavity 34. The flat layer 321 of the sacrificial layer 32 and the medium insulation layer 25c under the flat layer 321 are eroded away so as to form a chamber 36. The remaining part of the sacrificial layer 32 (e.g. the part covering the medium insulation layer 25c) after the eroding process forms the anchor point 32a for supporting the sound-sensitive film. The anchor point 32a can be continuously located at entire edges of the sound-sensitive film, or can be dispersedly located at a single point or multi points of the edges of the sound-sensitive film, or can be located at a center of the sound-sensitive film. Under condition when the anchor point 32a is located at the center of the sound-sensitive film, the sound-sensitive film is insensitive to the stress generated in film fabricating or packaging, as a result that the product consistency of the sound-sensitive film can be much better.

Besides, in fabricating, a plurality of trenches 35 can be selectively formed on the sound-sensitive film to improve the characteristics of the micro-silicon condenser microphone according to actual requirements.

Figure 7:
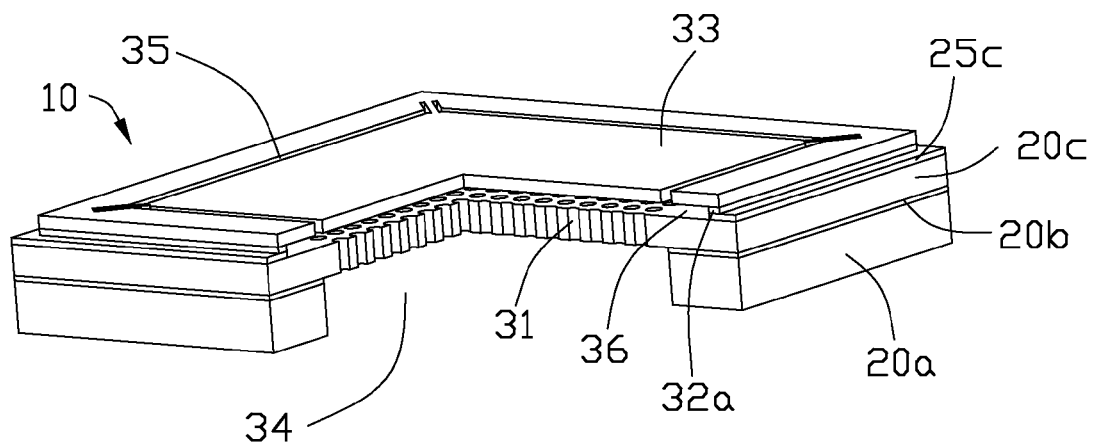
FIG. 7 is schematic perspective view of the chip fabricated by the above method with a corner thereof cut out.

Referring to FIGS. 6 and 7, a single integrated chip 10 fabricated by the above method includes a SOI base 20 having a first area 21 and a second area 22, an IC formed on the first area 21 and a micro-silicon condenser microphone formed on the second area 22. The SOI base 20 includes a silicon base 20a, an insulation silicon dioxide layer 20b covering the silicon base 20a and a silicon component layer 20c covering the insulation silicon dioxide layer 20b. The silicon component layer 20c includes a first surface and a second surface opposite to the first surface. According to the illustrated embodiment of the present invention, the first and the second surfaces are top and bottom surfaces of the silicon component layer 20c, respectively. The first area 21 and the second area 22 are located on the first surface.

The IC includes a field oxide layer 25a, a source/drain dopant area 23, a grid conducting layer 24, a medium insulation layer 25c, a metal conductive layer 26 and a passivation layer 27 etc. It is noticed that in fabricating the IC, at least the medium insulation layer 25c and the metal conductive layer 26 of the first area 21 extend to the second area 22.

The micro-silicon condenser microphone includes a first electrode plate formed by the silicon component layer 20c, the medium insulation layer 25c deposited on the silicon component layer 20c, a second electrode plate opposite to the first electrode plate, a chamber 36 formed between the first electrode plate and the second electrode plate, an anchor point 32a deposited on the medium insulation layer 25c for supporting the second electrode plate. According to the illustrated embodiment of the present invention, the first and the second electrode plates are backplate and sound-sensitive film, respectively, and the first and the second electrode plates function as a pair of electrode plates of the microphone capacitance. The material of the second electrode plate and the anchor point 32a is a Poly Sil-xGex film. The Poly Sil-xGex film is formed via a LPCVD process under 400 degrees or a PECVD process. The anchor point 32a can be continuously located at entire edges of the sound-sensitive film, or can be dispersedly located at a single point or multi points of the edges of the sound-sensitive film, or can be located at a center of the sound-sensitive film.

Besides, the micro-silicon condenser microphone includes a back cavity 34 extending through the second surface and a plurality of sound holes 31 communicating the back cavity 34 and the chamber 36. The back cavity 34 extends through the entire silicon base 20a and the insulation silicon dioxide layer 20b. The sound holes 31 are formed at the silicon component layer 20c and extend through the entire silicon component layer 20c. The second plate is a movable structure. Besides, a plurality of trenches 35 are formed on the sound-sensitive film and in communication with the chamber 36 so as to improve the characteristics of the micro-silicon condenser microphone. The IC and the micro-silicon condenser microphone are electrically connected with each other through the metal conductive layer 26.

According to the illustrated embodiment of the present invention, a method of "subsequent semiconductor process" based on the standard semiconductor process is disclosed. In brief, after the conventional standard semiconductor process, the method according to the present invention further includes steps of fabricating the micro-silicon condenser microphone on a single SOI substrate. The steps of fabricating the micro-silicon condenser microphone include fabricating the backplate by a low-temperature technique, fabricating the sound-sensitive film and fabricating the sacrificial layer 32 etc. As a result, the micro-silicon condenser microphone can be integrated with the IC on the single SOI substrate so as to ultimately form a high-sensitive single integrated chip.

It is to be understood, however, that even though numerous, characteristics and advantages of the present invention have been set forth in the foregoing description, together with details of the structure and function of the invention, the disclosed is illustrative only, and changes may be made in detail, especially in matters of number, shape, size, and arrangement of parts within the principles of the invention to the full extent indicated by the broadest general meaning of the terms in which the appended claims are expressed.

What is claimed is:

1. A method for integrating an Integrated Circuit (IC) and a micro-silicon condenser microphone, comprising the following steps:
   S1) providing a SOI (Silicon On Insulator) base having a first surface, the first surface comprising a first area for fabricating the IC and a second area for fabricating the micro-silicon condenser microphone, the SOI base comprising a silicon component layer;
   S2) fabricating the IC on the first area for electrically connecting the micro-silicon condenser microphone through a standard semiconductor process, and forming a metal conductive layer and a medium insulation layer on the second area simultaneously fabricated with the IC;
   S3) partly removing the medium insulation layer to expose the silicon component layer, then further partly removing the silicon component layer so as to form a backplate diagram and a plurality of sound holes, the silicon component layer acting as a first electrode plate of a microphone capacitance;
   S4) depositing a sacrificial layer above the SOI base via a low-temperature deposition process, the sacrificial layer filling in the sound holes;
   S5) forming a Poly Si1-xGex film on the sacrificial layer, the Poly Si1-xGex film acting as a second electrode plate of the microphone capacitance;
   S6) forming a back cavity on a second surface of the SOI base opposite to the first surface; and
   S7) eroding the sacrificial layer from the sound holes to form a chamber between the first electrode plate and the second electrode plate and further release the second electrode plate to be a movable structure, the chamber being in communication with the back cavity through the sound holes.

2. The method as claimed in claim 1, wherein in the step S1), the SOI base comprises a silicon base and an insulation silicon dioxide layer covering the silicon base, the silicon component layer covering the insulation silicon dioxide layer.

3. The method as claimed in claim 2, wherein in the step S3), a sub step of partly removing the silicon component layer is automatically terminated at the insulation silicon dioxide layer; and wherein in the step S6), the back cavity extends through the insulation silicon dioxide layer and the silicon base.

4. The method as claimed in claim 1, wherein in the step S2), the IC is a Metal Oxide Semiconductor Field Effect Transistor (MOSFET) which comprises a field oxide layer, a source/drain dopant area, a grid conducting layer, a medium insulation layer, a metal conductive layer and a passivation layer; simultaneously, the metal conductive layer and the medium insulation layer formed on the first area further extend to the second area.

5. The method as claimed in claim 1, wherein in the step S4), the material of the sacrificial layer is a Poly Ge film which is made via a Low Pressure Chemical Vapor Deposition (LPCVD) process lower than 400-degree temperature or a Plasma Enhanced Chemical Vapor Deposition (PECVD) process.

6. The method as claimed in claim 1, wherein in the step S4), the material of the sacrificial layer is a silicon dioxide which is made via a Plasma Enhanced Chemical Vapor Deposition (PECVD) process.

7. The method as claimed in claim 1, wherein in the step S5), the Poly Si1-xGex film is made via a Low Pressure Chemical Vapor Deposition (LPCVD) process lower than 400-degree temperature or a Plasma Enhanced Chemical Vapor Deposition (PECVD) process.

8. The method as claimed in claim 7, wherein in the step S5), during forming the Poly Si1-xGex film on the sacrificial layer, silane or germane or borane is selected as a reactant.

9. The method as claimed in claim 2, wherein in the step S6), the back cavity is formed by lithographing the second surface of the SOI base corresponding to the second area, and then removing part of the insulation silicon dioxide layer of the SOI base via an anisotropic wet etching process or a dry etching process.

10. The method as claimed in claim 9, wherein the anisotropic wet etching process adopts KOH or tetramethylammonium hydroxide (TMAH) as an etchant.

11. The method as claimed in claim 9, wherein the dry etching process is a Deep Reactive Ion Etching (DRIE) process.

12. The method as claimed in claim 5, wherein in the step S7), heated hydrogen peroxide is adopted to erode the sacrificial layer from the sound holes to expose the sound holes, while the first electrode plate and the second electrode plate can not be eroded by the heated hydrogen peroxide; and then the medium insulation layer is subsequently eroded by dilute hydrofluoric acid so as to form the chamber.

13. The method as claimed in claim 6, wherein in the step S7), the dilute hydrofluoric acid is adopted to simultaneously erode away the sacrificial layer and the medium insulation layer under the sacrificial layer.

14. The method as claimed in claim 1, wherein in the step S4), the sacrificial layer comprises a flat layer covering the medium insulation layer; and wherein in the step S5), the Poly Si1-xGex film not only covers the flat layer but also covers the medium insulation layer, the first electrode plate and the second electrode plate being a backplate and a sound-sensitive film, respectively.

15. The method as claimed in claim 14, wherein in the step S7), remaining part of the sacrificial layer after eroding forms an anchor point for supporting the sound-sensitive film, the anchor point can be continuously located at entire edges of the sound-sensitive film, or can be dispersedly located at a single point or multi points of the edges of the sound-sensitive film, or can be located at a center of the sound-sensitive film.

* * * * *